United States Patent
Wu

(10) Patent No.: US 10,067,273 B2
(45) Date of Patent: Sep. 4, 2018

(54) COLOR FILTER SUBSTRATE AND MANUFACTURING METHOD THEREOF

(71) Applicant: HON HAI PRECISION INDUSTRY CO., LTD., New Taipei (TW)

(72) Inventor: Yung-Chih Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 31 days.

(21) Appl. No.: 15/168,106

(22) Filed: May 30, 2016

(65) Prior Publication Data

US 2016/0349419 A1    Dec. 1, 2016

(30) Foreign Application Priority Data

May 29, 2015   (TW) .............. 104117271 A

(51) Int. Cl.
  *G02B 5/22*    (2006.01)
  *G02B 5/20*    (2006.01)
  *G03F 7/00*    (2006.01)

(52) U.S. Cl.
  CPC ............ *G02B 5/201* (2013.01); *G03F 7/0007* (2013.01)

(58) Field of Classification Search
  CPC .......... G02B 5/201; G02B 5/003; G02B 5/22; G02B 5/223; G02B 5/20; G02F 1/133514; G02F 1/133512; G02F 1/133516; G02F 1/13394; G02F 2201/52; G02F 1/13439; G02F 2001/13396; G02F 1/1339; G02F 1/133509; G02F 2001/13398; G03F 7/0007; G03F 7/20; G03F 7/16; G03F 7/004

USPC ....... 359/891, 892, 890, 885, 580, 587, 589, 359/590
  See application file for complete search history.

(56) References Cited

U.S. PATENT DOCUMENTS

| | | | |
|---|---|---|---|
| 7,433,004 B2 | 10/2008 | Tsubata et al. | |
| 8,081,286 B2 | 12/2011 | Kim et al. | |
| 8,310,628 B2 * | 11/2012 | Sakata ............. | B29D 11/00634 349/106 |
| 9,030,767 B2 * | 5/2015 | Chen ........................ | G02B 5/22 359/890 |

FOREIGN PATENT DOCUMENTS

| | | |
|---|---|---|
| CN | 1707331 | 12/2005 |
| CN | 1892346 | 1/2007 |

* cited by examiner

*Primary Examiner* — Jade R Chwasz
(74) *Attorney, Agent, or Firm* — ScienBiziP, P.C.

(57) ABSTRACT

A color filter substrate includes a base layer and a number of color filter modules arranged on the base layer. Each color filter module includes two black matrix units arranged on the base layer and separated from each other, three color filter units arranged on the base layer and separated from each other by the two black matrix units, a first spacer element arranged on a first black matrix unit, and a second spacer element arranged on a second black matrix unit. Each color filter module is arranged in a linear arrangement. At least one portion of the first spacer element is made of a same material and during a same manufacturing process as a corresponding at least one of the color filter units. Each color filter unit corresponds to one predetermined color.

12 Claims, 18 Drawing Sheets

COLOR FILTER SUBSTRATE AND MANUFACTURING METHOD THEREOF

FIELD

The subject matter herein generally relates to color filter substrates, and more particularly to a color filter substrate of a display panel and a manufacturing method of the color filter substrate.

BACKGROUND

Generally, a display panel includes an array substrate and a color filter substrate. The color filter substrate may be supported on the array substrate by a plurality of spacer elements. The color filter substrate may include a plurality of color filter units and a plurality of black matrix units. The plurality of color filter units, the plurality of black matrix units, and the plurality of spacer elements may be made during separate manufacturing processes of the color filter.

BRIEF DESCRIPTION OF THE DRAWINGS

Implementations of the present technology will now be described, by way of example only, with reference to the attached figures.

DETAILED DESCRIPTION

Figure 1:
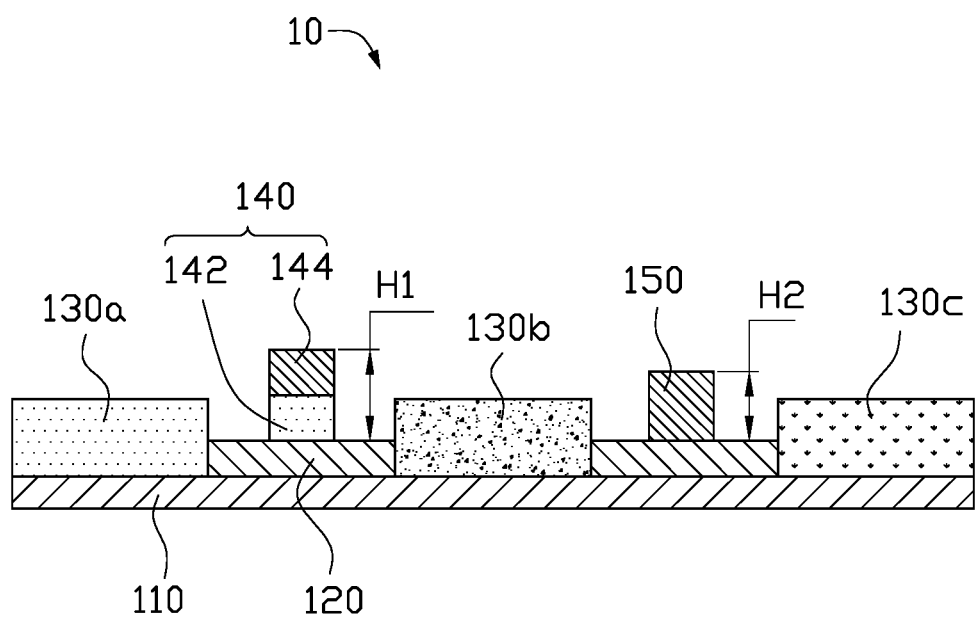
FIG. 1 is a cross-sectional view of a first embodiment of a color filter module of a color filter substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 illustrates a first embodiment of a color filter module 10 of a color filter substrate of a display panel (not shown). The color filter module 10 can include two black matrix units 120, a first spacer element 140 arranged on a first black matrix unit 120, a second spacer element 150 arranged on a second black matrix unit 120, and three color filter units, such as a first color filter unit 130a, a second color filter unit 130b, and a third color filter unit 130c. A plurality of color filter modules 10 can be arranged on a base layer 110 of the color filter substrate. Each of the plurality of color filter modules 10 can be linearly arranged on the base layer 110.

As illustrated in FIG. 1, a height of the three color filter units can be the same, and a height H1 of the first spacer element 140 can be greater than a height H2 of the second spacer element 150. The three color filter units can each be made during separate manufacturing processes. The first spacer element 140 can include a first photoresist 142 and a spacing layer 144. The first photoresist 142 can be made of a same material and during a same manufacturing process as one of the color filter units. The first photoresist 142 is made of the same material and during the same manufacturing process as the first color filter unit 130a, and a thickness of the first photoresist 142 is less than a thickness of the first color filter unit 130a. The spacing layer 144 and the second spacer element 150 are made of a same material and during a same manufacturing process. In at least one embodiment, the spacing layer 144 and the second spacer element 150 are made of polyimide. In at least one embodiment, the first color filter unit 130a is a red color filter, the second color filter unit 130b is a green color filter, and the third color filter unit 130c is a blue color filter.

Figure 2:
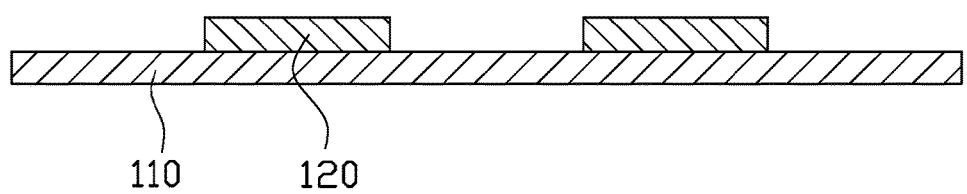
FIG. 2 is a cross-sectional view of the color filter module of FIG. 1 showing a first manufacturing process of the color filter substrate.

As illustrated in FIG. 2, the black matrix units 120 can be first made on the base layer 110. In at least one embodiment, the base layer 110 can be made of a substantially transparent material, such as glass, plastic, or other suitable material, and the black matrix units 120 can be made on the base layer 110 by a photolithographic method. The black matrix units 120 can be made of material that can block transmission of light, such as metal chromium, printing ink, or other suitable material. In at least one embodiment, the two black matrix units 120 of the plurality of color filter modules 10 can form a checkered pattern (not shown) on the base layer 110.

Figure 3:
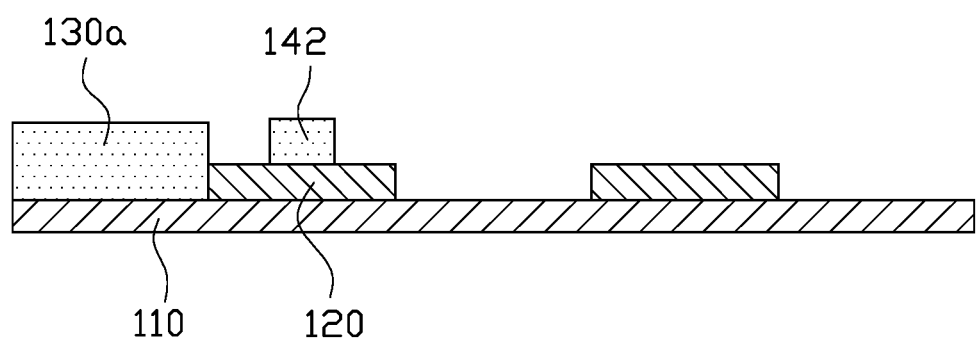
FIG. 3 is a cross-sectional view of the color filter module of FIG. 1 showing a second manufacturing process of the color filter substrate.

As illustrated in FIG. 3, the first photoresist 142 and the first color filter unit 130a can be made during the same manufacturing process. In at least one embodiment, a first color filter material layer (not shown) is deposited on the base layer 110 to cover the black matrix units 120. The first color filter unit 130a and the first photoresist 142 can be made by exposing, by a photolithographic method, corresponding portions of the first color filter material layer to create the first color filter unit 130a and the first photoresist 142 and remove excess portions of the first color filter material layer.

Figure 4:
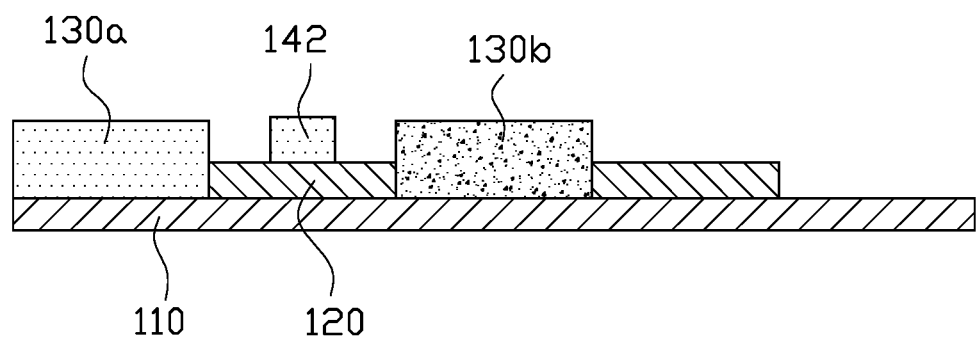
FIG. 4 is a cross-sectional view of the color filter module of FIG. 1 showing a third manufacturing process of the color filter substrate.

As illustrated in FIG. 4, the second color filter unit 130b can be made in a next manufacturing process after the first color filter unit 130a and the first photoresist 342 is made. In at least one embodiment, a second color filter material layer (not shown) is deposited on the base layer 110 to cover the black matrix units 120, the first color filter unit 130a, and the first photoresist 142. The second color filter unit 130b can be made by exposing, by a photolithographic method, corresponding portions of the second color filter material layer to create the second color filter unit 130b and remove excess portions of the second color filter material layer.

Figure 5:
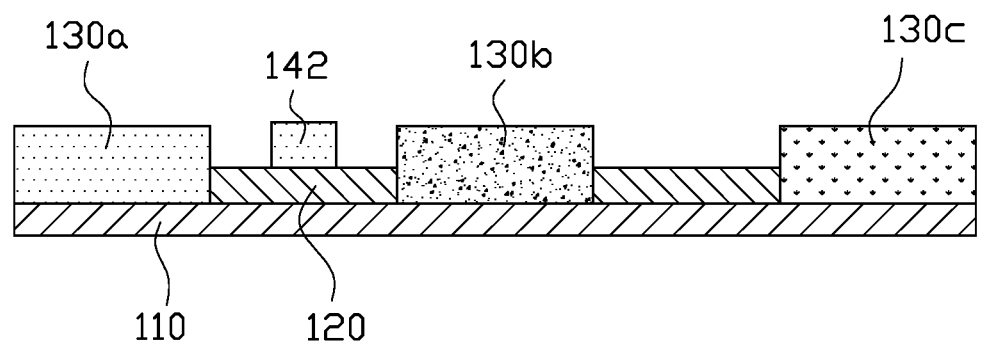
FIG. 5 is a cross-sectional view of the color filter module of FIG. 1 showing a fourth manufacturing process of the color filter substrate.

As illustrated in FIG. 5, the third color filter unit 130c can be made in a next manufacturing process after the second color filter unit 130b is made. In at least one embodiment, a third color filter material layer (not shown) is deposited on the base layer 110 to cover the black matrix units 120, the first color filter unit 130a, the first photoresist 142, and the second color filter unit 130b. The third color filter unit 130c can be made by exposing, by a photolithographic method, corresponding portions of the third color filter material layer to create the third color filter unit 130c and remove excess portions of the third color filter material layer.

Figure 6:
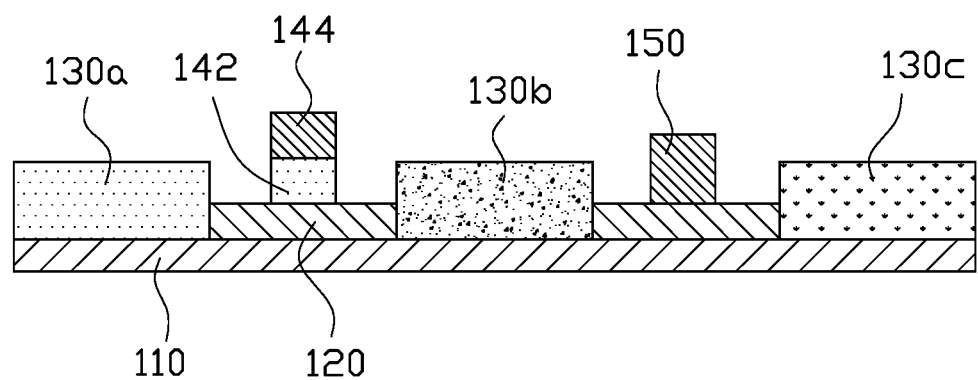
FIG. 6 is a cross-sectional view of the color filter module of FIG. 1 showing a fifth manufacturing process of the color filter substrate.

As illustrated in FIG. 6, the spacing layer 144 and the second spacer element 150 can be made in a next manufacturing process after the third color filter unit 130c is made. In at least one embodiment, a spacer material layer (not shown) is deposited on the base layer 110 to cover the black matrix units 120, the first color filter unit 130a, the first photoresist 142, the second color filter unit 130b, and the third color filter unit 130c. The spacing layer 144 and the second spacer element 150 can be made by etching corresponding portions of the spacer material layer to create the spacing layer 144 and the second spacer element 150 and remove excess portions of the spacer material layer.

In other embodiments, the first photoresist 142 can be made of a same material and during a same manufacturing process as either the second color filter unit 130b or the third color filter unit 130c.

Figure 7:
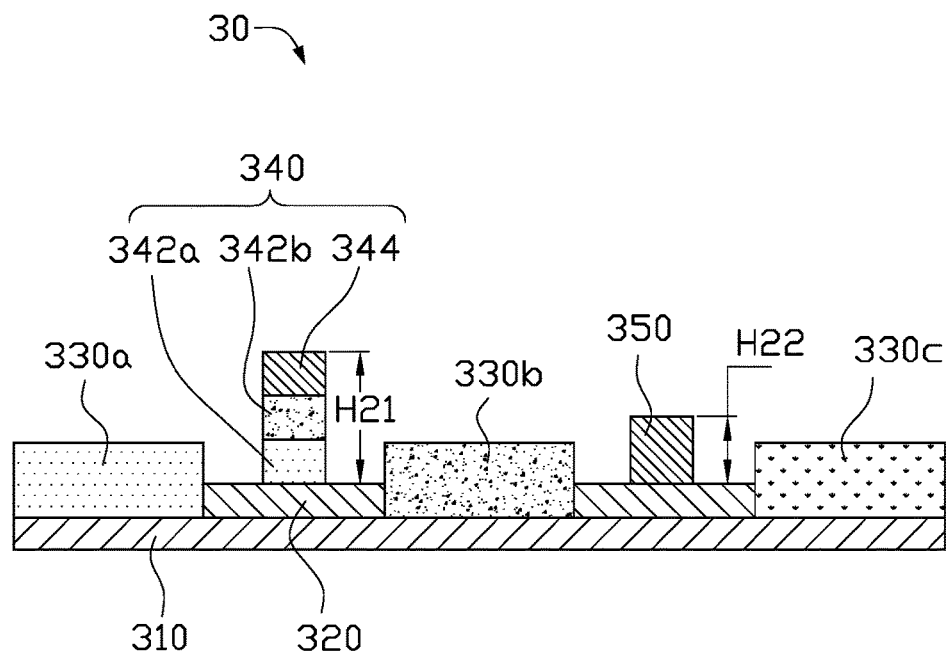
FIG. 7 is a cross-sectional view of a second embodiment of a color filter module of a color filter substrate.

FIG. 7 illustrates a second embodiment of a color filter module 30 of a color filter substrate of a display panel (not shown). The color filter module 30 can include two black matrix units 320, a first spacer element 340 arranged on a first black matrix unit 320, a second spacer element 350 arranged on a second black matrix unit 320, and three color filter units, such as a first color filter unit 330a, a second color filter unit 330b, and a third color filter unit 330c. A plurality of color filter modules 30 can be arranged on a base layer 310 of the color filter substrate. Each of the plurality of color filter modules 30 can be linearly arranged on the base layer 310.

As illustrated in FIG. 7, a height of the three color filter units can be the same, and a height H21 of the first spacer element 340 can be greater than a height H22 of the second spacer element 350. The three color filter units can each be made during separate manufacturing processes. The first spacer element 340 can include a first photoresist 342a, a second photoresist 342b, and a spacing layer 344. The first photoresist 342a can be made of a same material and during a same manufacturing process as a first one of the color filter units. The second photoresist 342b can be made of a same material and during a same manufacturing process as a second one of the color filter units. The first photoresist 342a is made of the same material and during the same manufacturing process as the first color filter unit 330a. The second photoresist 342b is made of the same material and during the same manufacturing process as the second color filter unit 330b. The first photoresist 342a and the second photoresist 342b each have a thickness that is less than a thickness of the first color filter unit 330a and the second color filter unit 330b. The spacing layer 344 and the second spacer element 350 are made of a same material and during a same manufacturing process. In at least one embodiment, the spacing layer 344 and the second spacer element 350 are made of polyimide. In at least one embodiment, the first color filter unit 330a is a red color filter, the second color filter unit 330b is a green color filter, and the third color filter unit 330c is a blue color filter.

Figure 8:
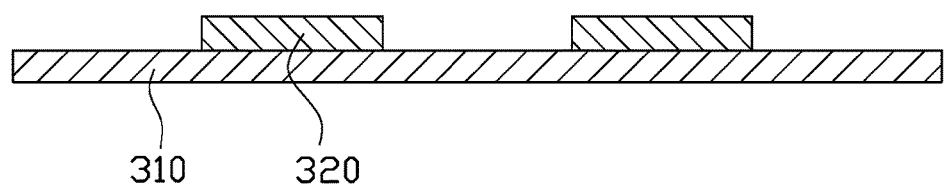
FIG. 8 is a cross-sectional view of the color filter module of FIG. 7 showing a first manufacturing process of the color filter substrate.

As illustrated in FIG. 8, the black matrix units 320 can be first made on the base layer 310. In at least one embodiment, the base layer 310 can be made of substantially transparent material, such as glass, plastic, or other suitable material, and the black matrix units 320 can be made on the base layer 310 by a photolithographic method. The black matrix units 320 can be made of material that can block transmission of light, such as metal chromium, printing ink, or other suitable material. In at least one embodiment, the two black matrix units 320 of the plurality of color filter modules 30 can form a checkered pattern (not shown) on the base layer 310.

Figure 9:
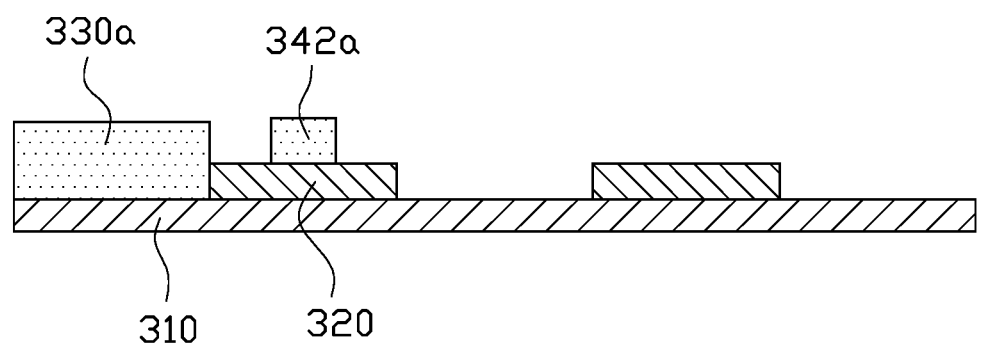
FIG. 9 is a cross-sectional view of the color filter module of FIG. 7 showing a second manufacturing process of the color filter substrate.

As illustrated in FIG. 9, the first photoresist 342a and the first color filter unit 330a can be made during the same manufacturing process. In at least one embodiment, a first color filter material layer (not shown) is deposited on the base layer 310 to cover the black matrix units 320. The first color filter unit 330a and the first photoresist 342a can be made by exposing, by a photolithographic method, corresponding portions of the first color filter material layer to create the first color filter unit 330a and the first photoresist 342a and remove excess portions of the first color filter material layer.

Figure 10:
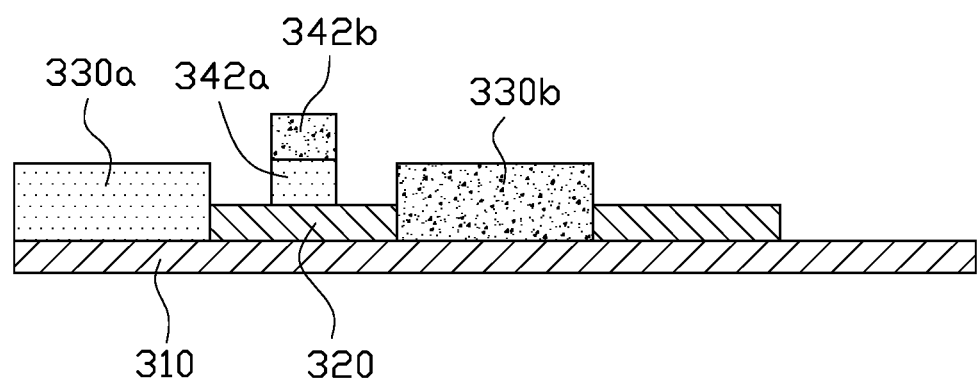
FIG. 10 is a cross-sectional view of the color filter module of FIG. 7 showing a third manufacturing process of the color filter substrate.

As illustrated in FIG. 10, the second photoresist 342b and the second color filter unit 330b can be made in a next manufacturing process after the first color filter unit 330a and the first photoresist 342a are made. In at least one embodiment, a second color filter material layer (not shown) is deposited on the base layer 310 to cover the black matrix units 320, the first color filter unit 330*a*, and the first photoresist 342*a*. The second color filter unit 330*b* can be made by exposing, by a photolithographic method, corresponding portions of the second color filter material layer to create the second color filter unit 330*b* and remove excess portions of the second color filter material layer.

Figure 11:
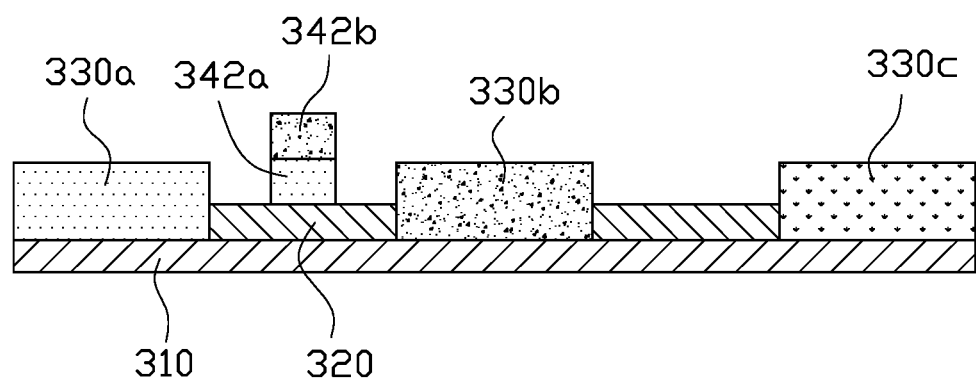
FIG. 11 is a cross-sectional view of the color filter module of FIG. 7 showing a fourth manufacturing process of the color filter substrate.

As illustrated in FIG. 11, the third color filter unit 330*c* can be made in a next manufacturing process after the second photoresist 342*b* and the second color filter unit 330*b* are made. In at least one embodiment, a third color filter material layer (not shown) is deposited on the base layer 310 to cover the black matrix units 320, the first color filter unit 330*a*, the first photoresist 342*a*, the second photoresist 342*b*, and the second color filter unit 330*b*. The third color filter unit 330*c* can be made by exposing, by a photolithographic method, corresponding portions of the third color filter material layer to create the third color filter unit 330*c* and remove excess portions of the third color filter material layer.

Figure 12:
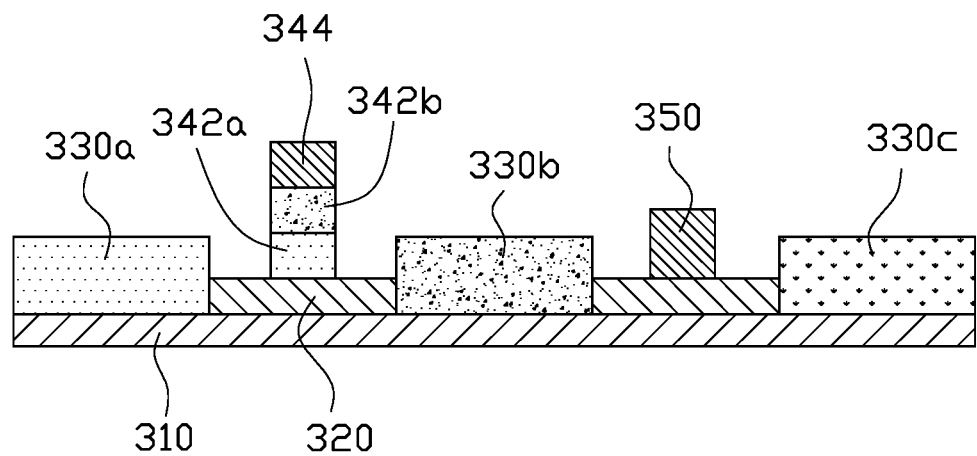
FIG. 12 is a cross-sectional view of the color filter module of FIG. 7 showing a fifth manufacturing process of the color filter substrate.

As illustrated in FIG. 12, the spacing layer 344 and the second spacer element 350 can be made in a next manufacturing process after the third color filter unit 330*c* is made. In at least one embodiment, a spacer material layer (not shown) is deposited on the base layer 310 to cover the black matrix units 320, the first color filter unit 330*a*, the first photoresist 342*a*, the second color filter unit 330*b*, the second photoresist 342*b*, and the third color filter unit 330*c*. The spacing layer 344 and the second spacer element 350 can be made by etching corresponding portions of the spacer material layer to create the spacing layer 344 and the second spacer element 350 and remove excess portions of the spacer material layer.

In other embodiments, the first photoresist 342*a* can be made of a same material and during a same manufacturing process as either the second color filter unit 330*b* or the third color filter unit 330*c*. The second photoresist 342*b* can be made of a same material and during a same manufacturing process as either the first color filter unit 330*a* or the third color filter unit 330*c*.

Figure 13:
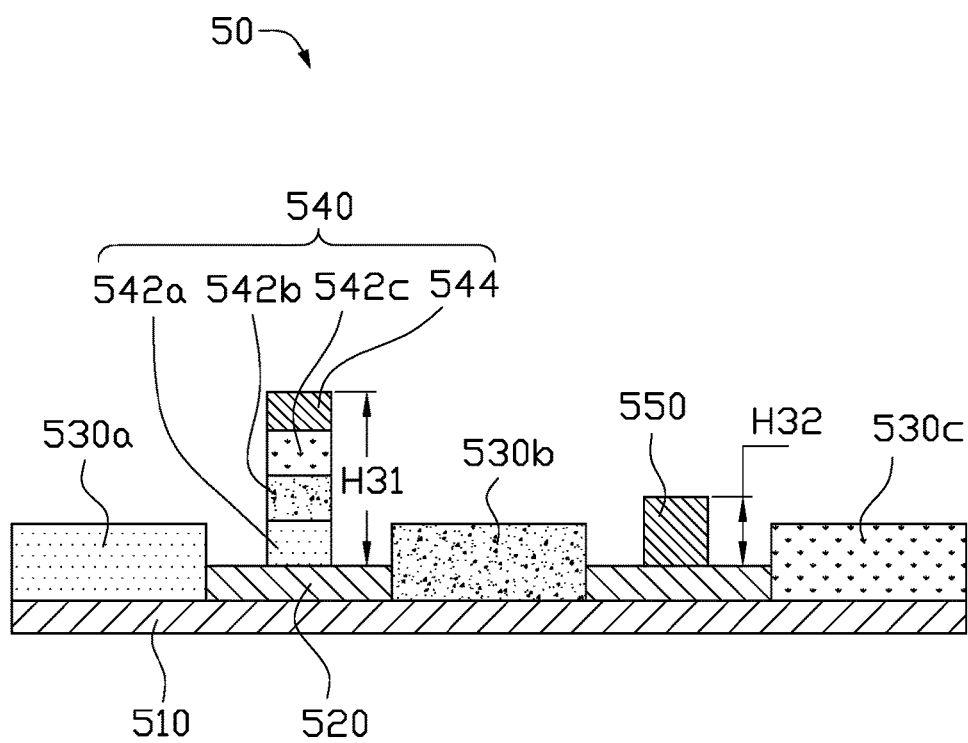
FIG. 13 is a cross-sectional view of a third embodiment of a color filter module of a color filter substrate.

FIG. 13 illustrates a third embodiment of a color filter module 50 of a color filter substrate of a display panel (not shown). The color filter module 50 can include two black matrix units 520, a first spacer element 540 arranged on a first black matrix unit 520, a second spacer element 550 arranged on a second black matrix unit 520, and three color filter units, such as a first color filter unit 530*a*, a second color filter unit 530*b*, and a third color filter unit 530*c*. A plurality of color filter modules 50 can be arranged on a base layer 510 of the color filter substrate. Each of the plurality of color filter modules 50 can be linearly arranged on the base layer 510.

As illustrated in FIG. 13, a height of the three color filter units can be the same, and a height H31 of the first spacer element 540 can be greater than a height H32 of the second spacer element 550. The three color filter units can each be made during separate manufacturing processes. The first spacer element 540 can include a first photoresist 542*a*, a second photoresist 542*b*, a third photoresist 542*c*, and a spacing layer 544. The first photoresist 542*a* can be made of a same material and during a same manufacturing process as a first one of the color filter units, the second photoresist 542*b* can be made of a same material and during a same manufacturing process as a second one of the color filter units, and the third photoresist 542*c* can be made of a same material and during a same manufacturing process as a third one of the color filter units. In the third embodiment, the first photoresist 542*a* is made of the same material and during the same manufacturing process as the first color filter unit 530*a*. The second photoresist 542*b* is made of the same material and during the same manufacturing process as the second color filter unit 530*b*. The third photoresist 542*c* is made of the same material and during the same manufacturing process as the third color filter unit 530*c*. A thickness of the first photoresist 542*a*, the second photoresist 542*b*, and the third photoresist 542*c* is less than a thickness of the first color filter unit 530*a*, the second color filter unit 530*b*, and the third color filter unit 530*c*. The spacing layer 544 and the second spacer element 550 are made of a same material and during a same manufacturing process. In at least one embodiment, the spacing layer 544 and the second spacer element 550 are made of polyimide. In at least one embodiment, the first color filter unit 530*a* is a red color filter, the second color filter unit 530*b* is a green color filter, and the third color filter unit 530*c* is a blue color filter.

Figure 14:
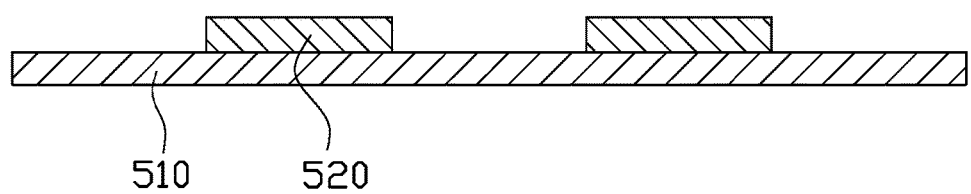
FIG. 14 is a cross-sectional view of the color filter module of FIG. 13 showing a first manufacturing process of the color filter substrate.

As illustrated in FIG. 14, the black matrix units 520 can be first made on the base layer 510. In at least one embodiment, the base layer 510 can be made of substantially transparent material, such as glass, plastic, or other suitable material, and the black matrix units 520 can be made on the base layer 510 by a photolithographic method. The black matrix units 520 can be made of material that can block transmission of light, such as metal chromium, printing ink, or other suitable material. In at least one embodiment, the two black matrix units 520 of the plurality of color filter modules 50 can form a checkered pattern (not shown) on the base layer 510.

Figure 15:
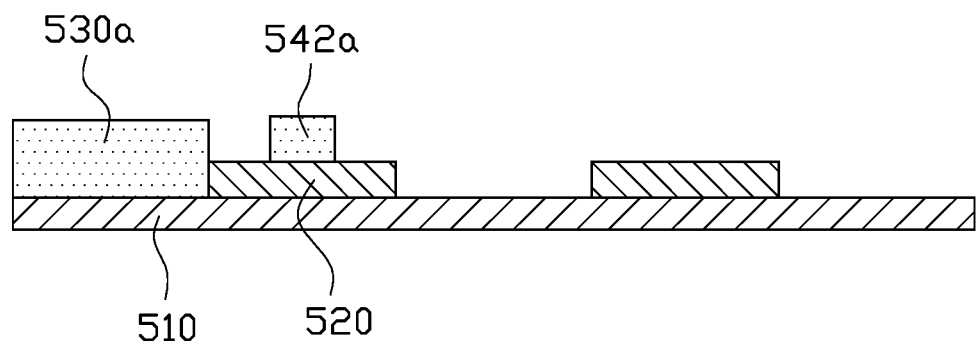
FIG. 15 is a cross-sectional view of the color filter module of FIG. 13 showing a second manufacturing process of the color filter substrate.

As illustrated in FIG. 15, the first photoresist 542*a* and the first color filter unit 530*a* can be made during the same manufacturing process. In at least one embodiment, a first color filter material layer (not shown) is deposited on the base layer 510 to cover the black matrix units 520. The first color filter unit 530*a* and the first photoresist 542*a* can be made by exposing, by a photolithographic method, corresponding portions of the first color filter material layer to create the first color filter unit 530*a* and the first photoresist 542*a* and remove excess portions of the first color filter material layer.

Figure 16:
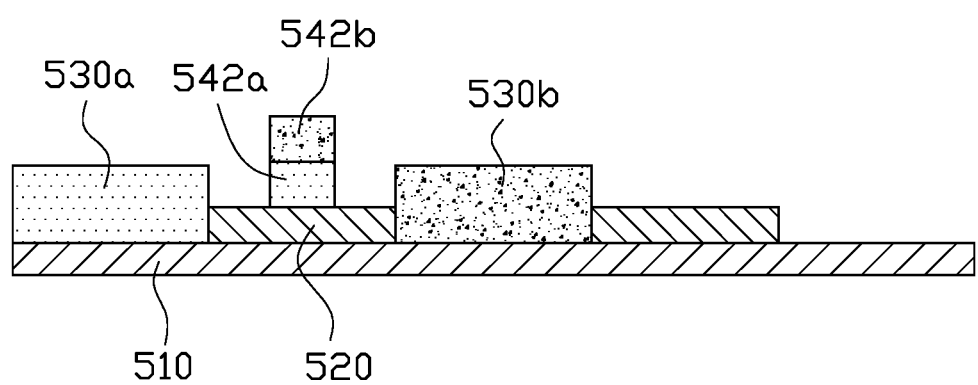
FIG. 16 is a cross-sectional view of the color filter module of FIG. 13 showing a third manufacturing process of the color filter substrate.

As illustrated in FIG. 16, the second photoresist 542*b* and the second color filter unit 530*b* can be made in a next manufacturing process after the first color filter unit 530*a* and the first photoresist 542*a* are made. In at least one embodiment, a second color filter material layer (not shown) is deposited on the base layer 510 to cover the black matrix units 520, the first color filter unit 530*a*, and the first photoresist 542*a*. The second color filter unit 530*b* can be made by exposing, by a photolithographic method, corresponding portions of the second color filter material layer to create the second color filter unit 530*b* and remove excess portions of the second color filter material layer.

Figure 17:
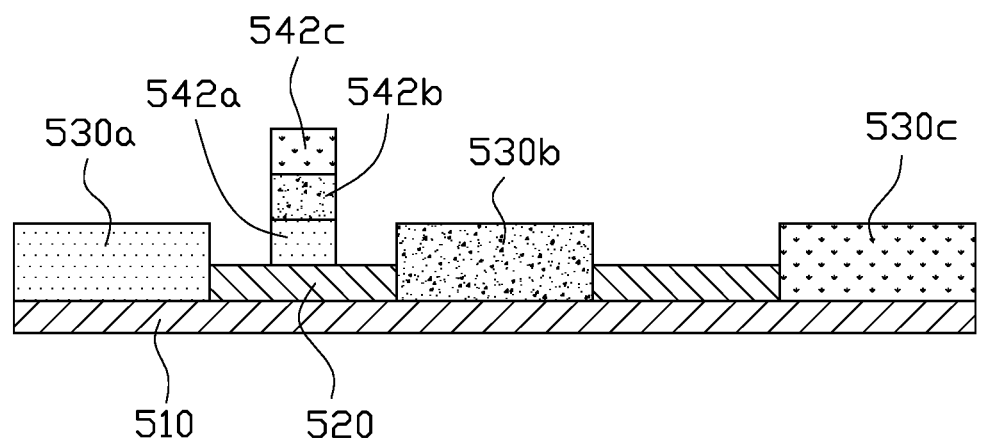
FIG. 17 is a cross-sectional view of the color filter module of FIG. 13 showing a fourth manufacturing process of the color filter substrate.

As illustrated in FIG. 17, the third photoresist 542*c* and the third color filter unit 530*c* can be made in a next manufacturing process after the second photoresist 542*b* and the second color filter unit 530*b* are made. In at least one embodiment, a third color filter material layer (not shown) is deposited on the base layer 510 to cover the black matrix units 520, the first color filter unit 530*a*, the first photoresist 542*a*, the second photoresist 542*b*, and the second color filter unit 530*b*. The third color filter unit 530*c* can be made by exposing, by a photolithographic method, corresponding portions of the third color filter material layer to create the third color filter unit 530*c* and remove excess portions of the third color filter material layer.

Figure 18:
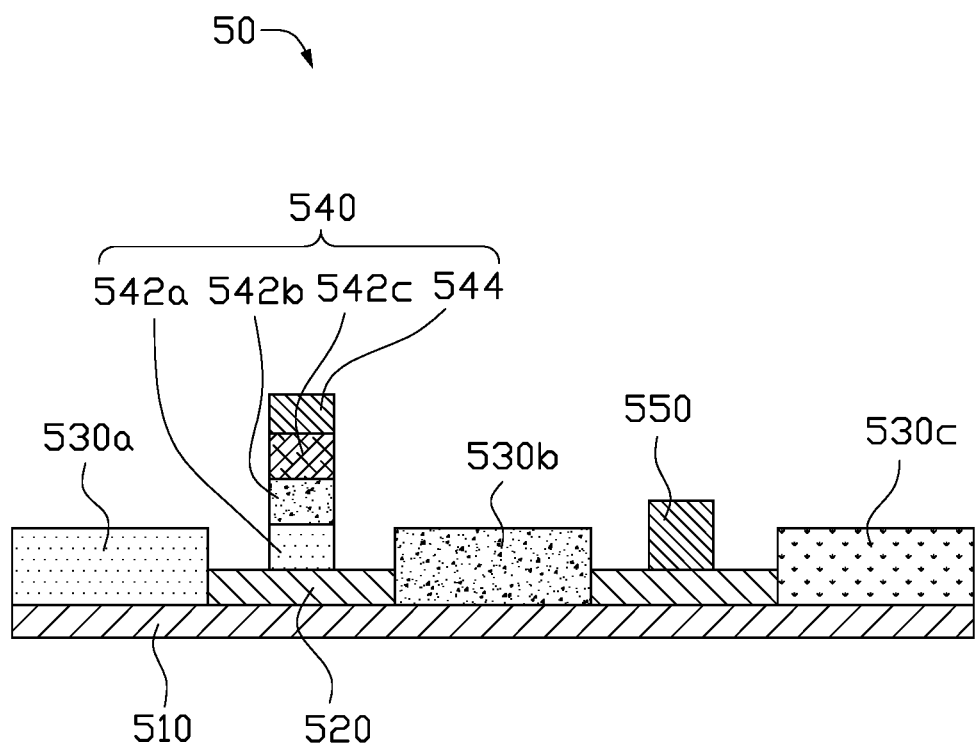
FIG. 18 is a cross-sectional view of the color filter module of FIG. 13 showing a fifth manufacturing process of the color filter substrate.

As illustrated in FIG. 18, the spacing layer 544 and the second spacer element 550 can be made in a next manufacturing process after the third color filter unit 530c and the third photoresist 542c are made. In at least one embodiment, a spacer material layer (not shown) is deposited on the base layer 510 to cover the black matrix units 520, the first color filter unit 530a, the first photoresist 542a, the second color filter unit 530b, the second photoresist 542b, the third color filter unit 530c, and the third photoresist 542c. The spacing layer 544 and the second spacer element 550 can be made by etching corresponding portions of the spacer material layer to create the spacing layer 544 and the second spacer element 550 and remove excess portions of the spacer material layer.

In other embodiments, the first photoresist 542a can be made of a same material and during a same manufacturing process as either the second color filter unit 530b or the third color filter unit 530c. The second photoresist 542b can be made of a same material and during a same manufacturing process as either the first color filter unit 530a or the third color filter unit 530c. The third photoresist 542c can be made of a same material and during a same manufacturing process as either the first color filter unit 530a or the second color filter unit 530b.

The photoresists of the color filter modules 10, 30, 50, are made of a same material and during a same manufacturing process as the corresponding color filter units, thereby improving efficiency of manufacturing the color filter substrate and improving a display uniformity of the display panel.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A color filter substrate comprising:
   a base layer;
   a plurality of color filter units on the base layer;
   a black matrix unit layer on the base layer, the black matrix unit layer configured to separate the plurality of color filter units from each other;
   a first spacer element on a side of the black matrix unit layer away from the base layer, the first spacer element comprising at least one photoresist layer on the black matrix unit layer and a spacing layer on the at least one photoresist layer, the at least one photoresist layer being made of a same material as at least one of the plurality of color filter units; and
   a second spacer element on a side of the black matrix unit layer away from the base layer;
   wherein a height of the first spacer element is greater than a height of the second spacer element;
   the spacing layer and the second spacer element are made of a same material.

2. The color filter substrate of claim 1, wherein: the spacing layer and the second spacer element are made of polyimide.

3. The color filter substrate of claim 1, wherein: the base layer is transparent.

4. The color filter substrate of claim 1, wherein: the black matrix unit layer is made of a material that is capable of blocking transmission of light.

5. The color filter substrate of claim 1, wherein: the at least one photoresist layer is between the black matrix unit layer and the spacing layer.

6. A method for making a color filter substrate, comprising:
   providing a base layer;
   forming a black matrix unit layer on a base layer;
   forming a plurality of color filter units on the base layer and at least one photoresist layer on the black matrix unit layer, the plurality of color filter units separated from each other by the black matrix unit layer, the at least one photoresist layer being made of a same material as at least one of the plurality of color filter units;
   forming a spacing layer on the at least one photoresist layer, the at least one photoresist layer and the spacing layer cooperatively forming a first spacer element; and
   forming a second spacer element on the black matrix unit layer;
   wherein a height of the first spacer element is greater than a height of the second spacer element;
   both the first spacer element and the second spacer element are on a side of the black matrix unit layer away from the base layer;
   the spacing layer and the second spacer element are made of a same material and made by a single process.

7. The method of claim 6, wherein: the plurality of color filter units comprises a plurality of first color filter units, a plurality of second color filter units, and a plurality of third color filter units, forming a plurality of color filter units on the base layer comprises:
   forming the plurality of first color filter units on the base layer;
   forming the plurality of second color filter units on the base layer; and
   forming the plurality of third color filter units on the base layer.

8. The method of claim 7, wherein: the at least one photoresist layer is a single layer made of a same material as the plurality of first color filter units; the at least one photoresist layer and the plurality of first color filter units are made by a single process.

9. The method of claim 7, wherein: the at least one photoresist layer comprises a first layer made of a same material as the plurality of first color filter units and a second layer made of a same material as the plurality of second color filter units; the first layer and the plurality of first color filter units are made by a single process; the second layer and the plurality of second color filter units are made by a single process.

10. The method of claim 7, wherein: the at least one photoresist layer comprises a first layer made of a same material as the plurality of first color filter units, a second layer made of a same material as the plurality of second color filter units, and a third layer made of a same material as the plurality of third color filter units; the first layer and the plurality of first color filter units are made by a single process; the second layer and the plurality of second color filter units are made by a single process; the third layer and the plurality of third color filter units are made by a single process.

11. The method of claim 6, wherein: the spacing layer and the second spacer element are made of polyimide.

12. The method of claim 6, wherein: the at least one photoresist layer is between the black matrix unit layer and the spacing layer.

* * * * *